(12) United States Patent
Lemke et al.

(10) Patent No.: US 9,276,107 B2
(45) Date of Patent: Mar. 1, 2016

(54) SEMICONDUCTOR DEVICE HAVING BURIED GATE ELECTRODE STRUCTURES

(71) Applicant: Infineon Technologies Dresden GmbH, Dresden (DE)

(72) Inventors: Marko Lemke, Dresden (DE); Rolf Weis, Dresden (DE); Stefan Tegen, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 14/613,438

(22) Filed: Feb. 4, 2015

(65) Prior Publication Data
US 2015/0145029 A1    May 28, 2015

Related U.S. Application Data

(62) Division of application No. 13/934,630, filed on Jul. 3, 2013, now Pat. No. 8,980,714.

(51) Int. Cl.
| | |
|---|---|
| *H01L 29/792* | (2006.01) |
| *H01L 29/94* | (2006.01) |
| *H01L 29/78* | (2006.01) |
| *H01L 29/66* | (2006.01) |
| *H01L 29/423* | (2006.01) |
| *H01L 21/8234* | (2006.01) |
| *H01L 29/06* | (2006.01) |

(52) U.S. Cl.
CPC .... *H01L 29/7813* (2013.01); *H01L 21/823437* (2013.01); *H01L 21/823487* (2013.01); *H01L 29/0696* (2013.01); *H01L 29/4236* (2013.01); *H01L 29/42376* (2013.01); *H01L 29/66553* (2013.01); *H01L 29/66621* (2013.01); *H01L 29/66734* (2013.01)

(58) Field of Classification Search
CPC ....... H01L 29/792; H01L 29/76; H01L 29/94; H01L 29/062; H01L 29/7813; H01L 29/0696; H01L 29/4236
USPC ........................................... 257/331; 438/586
See application file for complete search history.

(56) References Cited

U.S. PATENT DOCUMENTS

| | | | |
|---|---|---|---|
| 6,221,723 B1 | 4/2001 | Kunitou | |
| 7,274,077 B2 | 9/2007 | Henninger et al. | |
| 7,723,191 B2 | 5/2010 | Kang et al. | |
| 8,455,948 B2 | 6/2013 | Weis | |
| 8,502,274 B1* | 8/2013 | Matoy et al. | 257/208 |
| 2008/0113515 A1 | 5/2008 | Kim et al. | |
| 2008/0197442 A1 | 8/2008 | Hirler et al. | |
| 2010/0216290 A1 | 8/2010 | Lin et al. | |
| 2012/0175634 A1 | 7/2012 | Weis | |
| 2014/0151789 A1 | 6/2014 | Cotorogea et al. | |
| 2014/0167154 A1* | 6/2014 | Nelle et al. | 257/334 |

* cited by examiner

*Primary Examiner* — Phuc Dang
(74) *Attorney, Agent, or Firm* — Murphy, Bilak & Homiller, PLLC

(57) ABSTRACT

A semiconductor device includes first and second gate electrode structures and a connection plug. The first gate electrode structure is buried in a semiconductor portion and has array stripes inside a first cell array of transistor cells and a contact stripe outside the first cell array, the contact stripe structurally connected with the array stripes. The second gate electrode structure is buried in the semiconductor portion and has array stripes inside a second cell array of transistor cells. An array isolation region of the semiconductor portion separates the first and second gate electrode structures. The connection plug extends between a first surface of the semiconductor portion and the contact stripe of the first gate electrode structure.

8 Claims, 9 Drawing Sheets

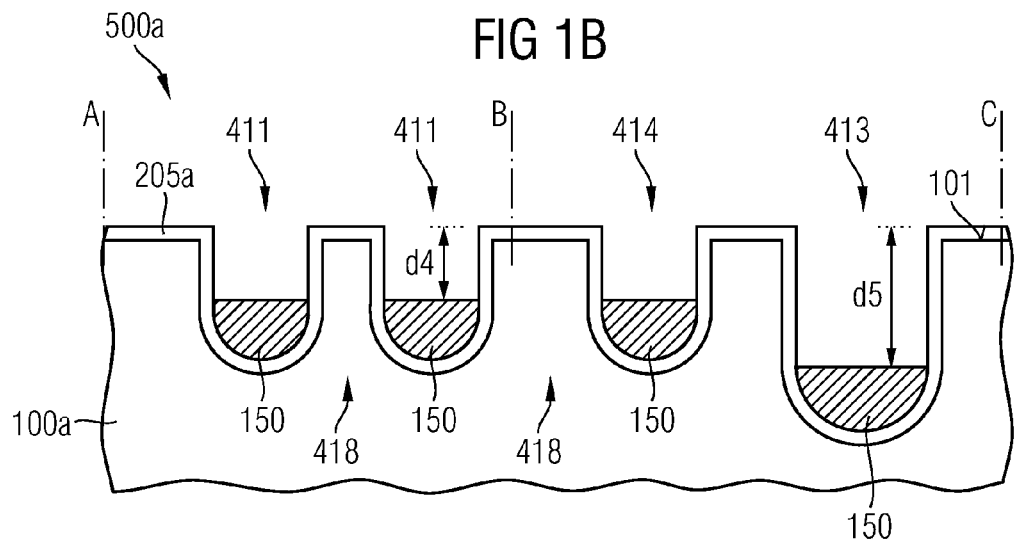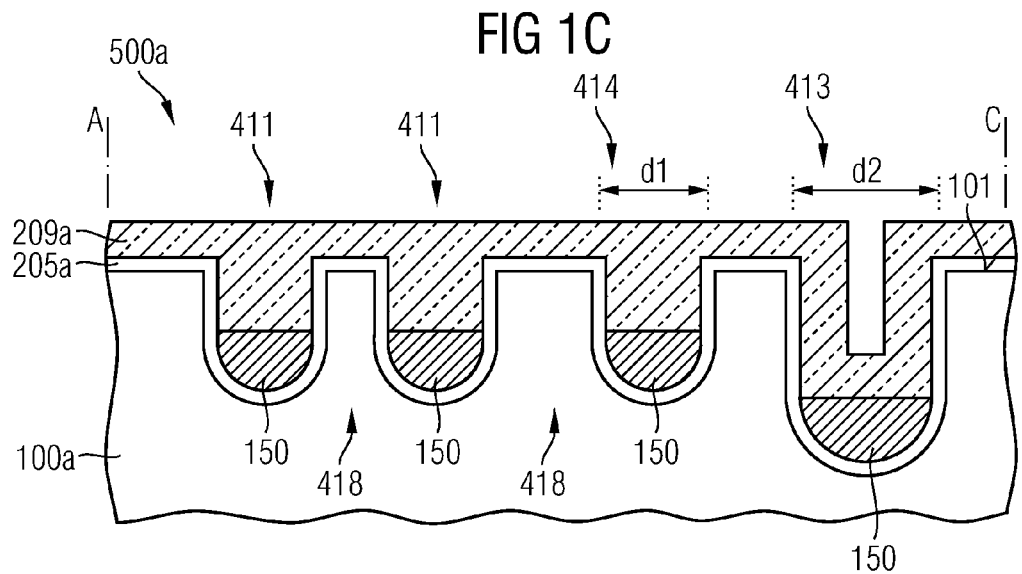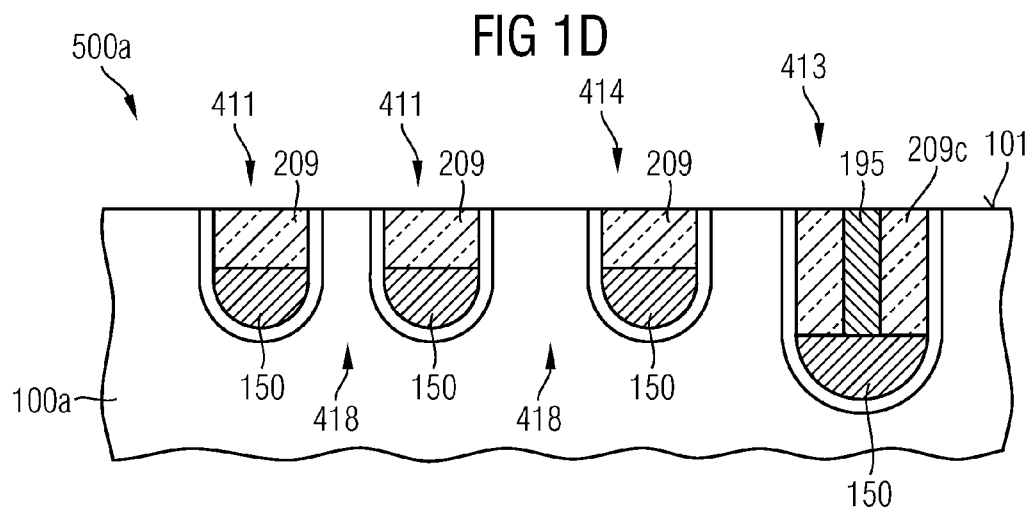

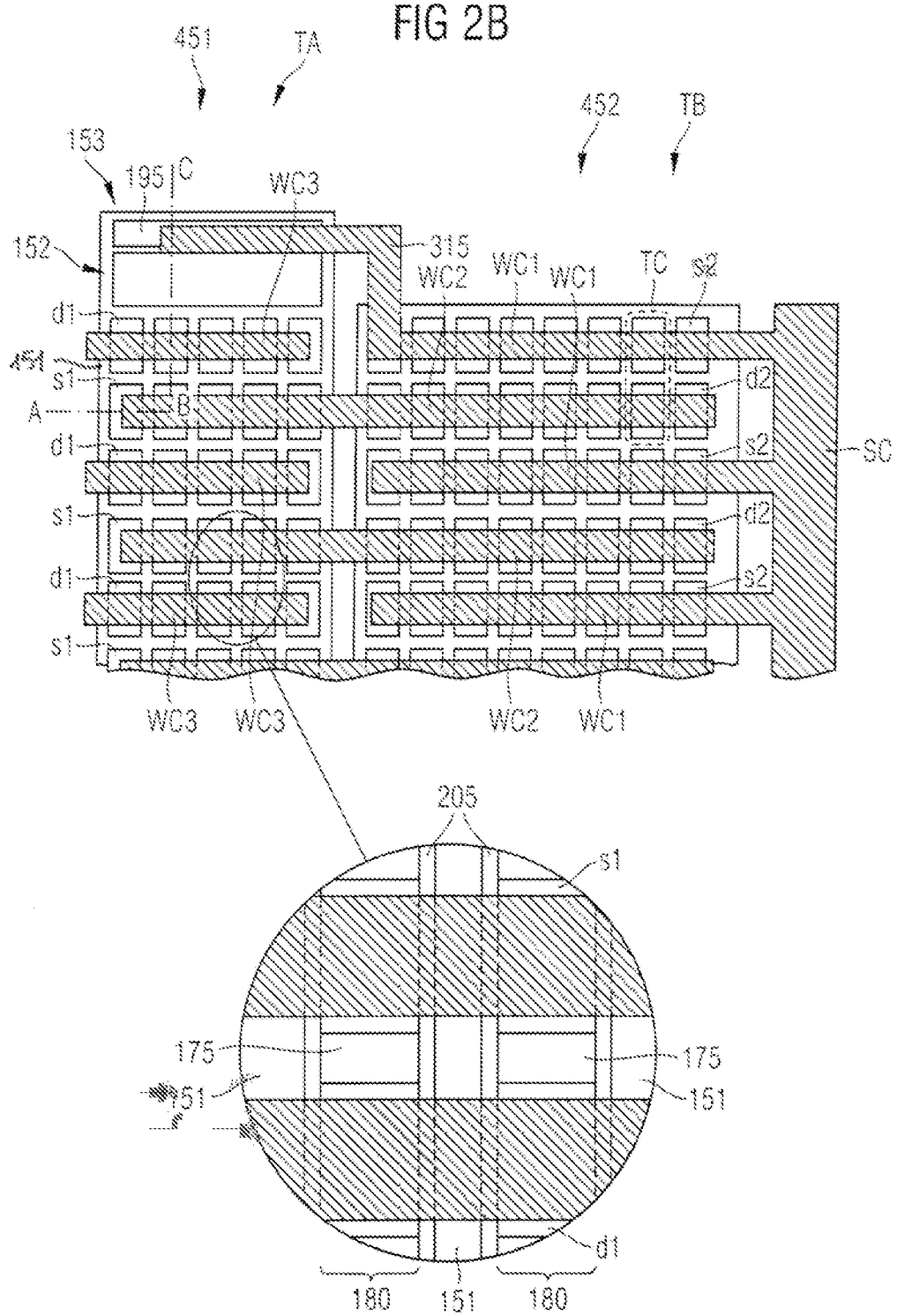

SEMICONDUCTOR DEVICE HAVING BURIED GATE ELECTRODE STRUCTURES

PRIORITY CLAIM

This application is a Divisional of U.S. patent application Ser. No. 13/934,630, filed Jul. 3, 2013, and patented on Mar. 17, 2015 as U.S. Pat. No. 8,980,714, said application incorporated herein by reference in its entirety.

BACKGROUND

Power semiconductor devices like MOSFETs (metal oxide semiconductor field effect transistors) are designed to sustain a high breakdown voltage in a blocking mode and to provide a low on-state resistance in a conductive mode. Power semiconductor devices therefore usually include a drift region between a voltage-controlled body/channel region and a drain region. Increasing the length of the drift zone increases the voltage blocking capability, but at the same time increases the on-state resistance. A power semiconductor device may integrate two or more transistors arranged in series, in parallel or in other configurations in the same semiconductor die to implement specific functions and/or to obtain specific device characteristics. It is desirable to provide reliable semiconductor devices and methods that provide a simple and cost effective manufacturing process.

SUMMARY

In accordance with an embodiment, a method of manufacturing a semiconductor device includes introducing at least a first and a second trench pattern from a first surface into a semiconductor substrate. An array isolation region including a portion of the semiconductor substrate separates the first and second trench patterns. At least the first trench pattern includes array trenches and a contact trench that is structurally connected with the array trenches. A buried gate electrode structure is provided in a lower section of the first and second trench patterns, in a distance to the first surface. A connection plug is provided between the first surface and the gate electrode structure in the contact trench.

According to another embodiment, a semiconductor device includes a first and a second gate electrode structure buried in a semiconductor portion. The first gate electrode structure includes array stripes arranged inside a first cell array of transistor cells and a contact stripe outside the first cell array. The contact stripe is structurally connected with the array stripes. The second gate electrode structure includes array stripes inside a second cell array of transistor cells. An array isolation region of the semiconductor portion separates the first and second gate electrode structures. A connection plug extends between a first surface of the semiconductor portion and the contact stripe of the first gate electrode structure.

A further embodiment refers to a power semiconductor device with an active drift zone. The power semiconductor device includes a first and a second gate electrode structure which are buried in a semiconductor portion. The first gate electrode structure includes array stripes inside a first cell array of transistor cells and a contact stripe outside the first cell array. The contact stripe is structurally connected with the array stripes. The second gate electrode structure includes array stripes inside a second cell array of transistor cells. An array isolation region of the semiconductor portion separates the first and second gate electrode structures. A connection plug extends between a first surface of the semiconductor portion and the contact stripe. A connection wiring directly adjoins active semiconductor areas of the transistor cells in the second cell array and the connection plug.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and, together with the description, serve to explain principles of the disclosure. Other embodiments and intended advantages will be readily appreciated as they become better understood by reference to the following detailed description.

FIG. 1B is a schematic cross-sectional view of the semiconductor substrate portion of FIG. 1A along line A-B-C after recessing a gate material deposited into the trench patterns.

FIG. 1C is a schematic cross-sectional view of the semiconductor substrate portion of FIG. 1A along line A-B-C after depositing a dielectric fill material.

FIG. 1D is a schematic cross-sectional view of the semiconductor substrate portion of FIG. 1C after planarizing a deposited further conductive material forming a connection plug.

FIG. 2B is a schematic plan view of a portion of the semiconductor device of FIG. 2A.

DETAILED DESCRIPTION

Figure 1A:
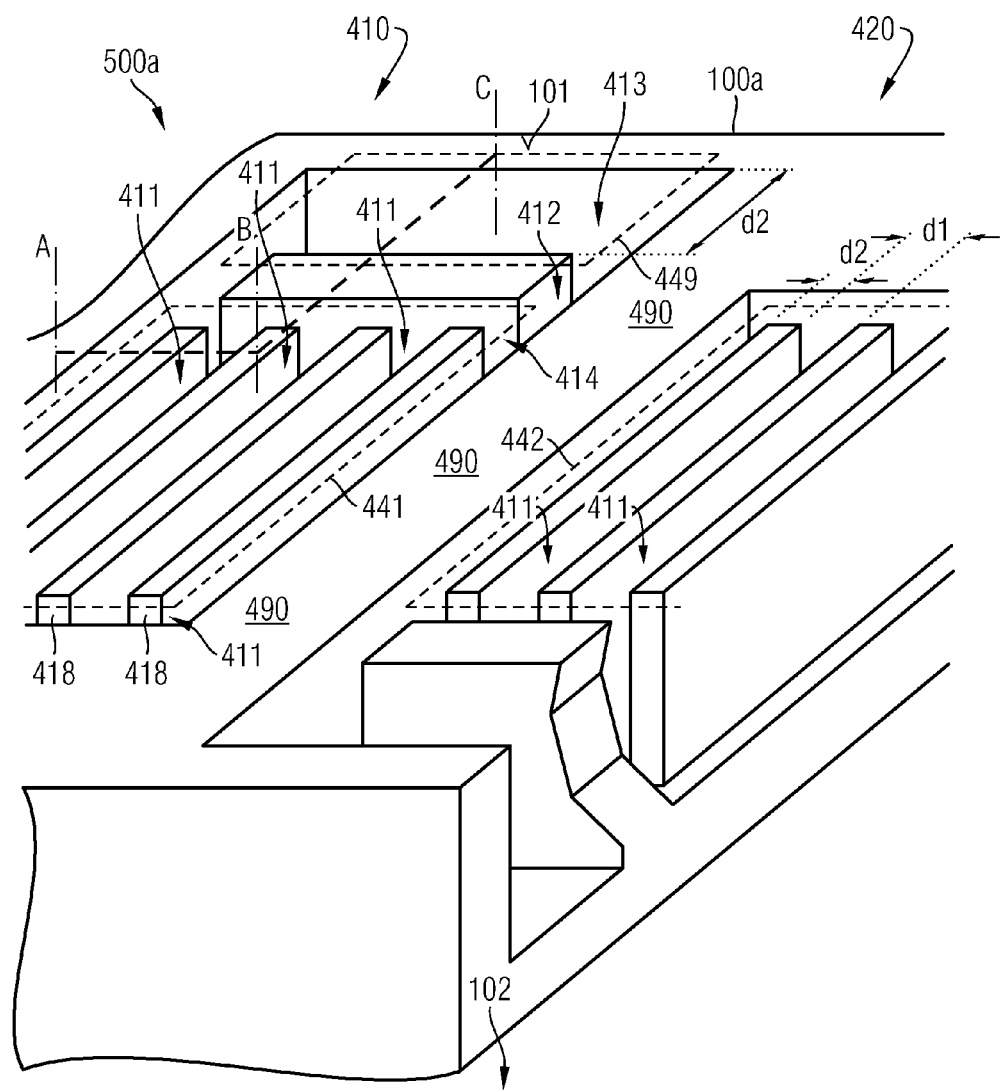
FIG. 1A is a schematic perspective view of a portion of a semiconductor substrate for illustrating a method of manufacturing a semiconductor device in accordance with an embodiment relying on different trench widths for providing a self-aligned gate connection, after introducing trench patterns into the semiconductor substrate.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same or similar elements have been designated by corresponding references in the different drawings if not stated otherwise.

The terms "having", "containing", "including", "comprising" and the like are open and the terms indicate the presence of stated structures, elements or features but are not intended to preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The method illustrated in FIGS. 1A to 1E relies on a semiconductor substrate 500*a* consisting of or containing a semiconductor layer 100*a* of a single-crystalline semiconductor material. The single-crystalline semiconductor material may be silicon Si, silicon carbide SiC, germanium Ge, a silicon germanium crystal SiGe, gallium nitride GaN or gallium arsenide GaAs, by way of example. For example, the semiconductor substrate 500*a* may be a silicon wafer. A plurality of identical semiconductor dies may be obtained from the semiconductor substrate 500*a*.

The semiconductor layer 100*a* has a planar first surface 101 and a planar second surface 102 parallel to the first surface 101. The normal to the first and second surfaces 101, 102 defines a vertical direction and directions orthogonal to the vertical direction are lateral directions.

At least a first and a second trench pattern 410, 420 are introduced into the semiconductor substrate 500*a* from the first surface 101. Further trench patterns may be formed in other portions of the semiconductor substrate 500*a*, e.g. contemporaneously with the first and second trench patterns 410, 420. An array isolation region 490, which consists of or at least includes a portion of the semiconductor substrate 500*a*, spatially separates the first and second trench patterns 410, 420 from each other. Further array isolation regions 490 may spatially separate the first and/or second trench patterns 410, 420 from one or more further trench patterns and/or some or all of the further trench patterns from each other. Each of the trench patterns 410, 420 and further trench patterns may be completely surrounded by an array isolation region 490 in the lateral directions, wherein each array isolation region 490 surrounds one single of the trench patterns.

The first and second trench patterns 410, 420 include array trenches 411. At least the first trench pattern 410 includes at least one contact trench 413, which is structurally connected with the array trenches 411 of the first trench pattern 410.

For example, a mask layer may be deposited on the first surface 101 and patterned by photolithographic means to generate an etch mask with mask openings exposing portions of the first surface 101 corresponding to the trenches of the first and second trench patterns 410, 420. A predominantly anisotropic etch removes semiconductor material of the semiconductor layer 100*a* in the vertical projection of the mask openings in the etch mask.

FIG. 1A shows the first and second trench patterns 410, 420 and the array isolation region 490 separating the first and second trench patterns 410, 420 from each other. The array trenches 411 may be parallel stripes, wherein semiconductor fins 418 are formed between neighboring array trenches 411. The array trenches 411 may have equal widths and may be equally spaced at a center-to-center distance (pitch) between 20 nm and 500 nm, for example between 150 nm and 250 nm. For example, the width d1 may be at least twice the width d3. Each of the trench patterns 410, 420 may define one or more semiconductor fins 418, for example one thousand or more semiconductor fins 418.

The array trenches 411 of the first trench pattern 410 are assigned to a first switching device and are formed within a first cell area 441. The array trenches 411 of the second trench pattern 420 are assigned to a second switching device and are formed within a second cell area 442. Array trenches of further trench patterns may be assigned to further switching devices. One, two or more auxiliary trenches 414 extending in a lateral direction intersecting the array trenches 411 may connect the array trenches 411 of the same trench pattern 410, 420 with each other.

The contact trench 413 is formed in a contact area 449 outside the first cell area 441. The contact trench 413 may run perpendicular or parallel to the array trenches 411 and may or may not directly adjoin the cell area 441. According to the illustrated embodiment, the contact trench 413 is spaced from the first cell area 441 and one, two or more spacer trenches 412 structurally connect the contact trench 413 with the array trenches 411 and/or with one or more of the auxiliary trenches 414. A width d2 of the contact trench 413 is greater than the width d1 of the widest array trench 411. The second trench pattern 420 and/or further trench patterns may or may not include a further contact trench, respectively.

The first and second trench patterns 410, 420 are arranged along a first lateral direction which may be orthogonal to the direction along which the array trenches 411 extend. The second trench pattern 420 may be arranged in the projection of the first trench pattern 410 along the first lateral direction. For example the cell areas 441, 442 may be arranged along the same lateral axis. Further trench patterns, which are structurally disconnected from the first and second trench patterns 410, 420, may be formed along the same lateral axis.

Referring to FIG. 1B, a gate dielectric layer 205*a* may be formed on the exposed semiconductor material of the semiconductor layer 100*a*. The formation of the gate dielectric layer 205*a* may include a thermal oxidation of the semiconductor material of the semiconductor layer 100*a* or the deposition of a dielectric material, for example silicon oxide, or both. According to an embodiment, providing the gate dielectric layer 205a includes a thermal oxidation of the semiconductor material of the semiconductor layer 100a, deposition of a silicon oxide using, e.g. TEOS (tetra ethyl ortho silane) as precursor material, and a further thermal treatment. Forming the gate dielectric layer 205a may include the formation of a silicon nitride or silicon oxynitride layer and/or the deposition of other dielectric materials.

A conductive gate material is deposited, which fills the trenches of the first and second trench patterns 410, 420. The conductive gate material may be heavily doped polycrystalline silicon. According to other embodiments, more than one gate material is deposited to form a layered structure that may include one or more metal-containing layer(s). The gate material(s) is/are recessed to form, in each trench pattern 410, 420 a contiguous gate electrode structure 150. The gate electrode structure 150 of the two cell areas 441, 442 are separated by a recess and/or polishing process taking place at the first surface 101.

The cross-sectional view of FIG. 1B shows the recessed gate material forming a contiguous gate electrode structure 150 in a lower section of the first trench pattern 410. An exposed surface of the gate electrode structure 150 has a distance d4 to the first surface 101 in the array trenches 411. The distance d4 may be greater than zero, for example in a range from 500 nm to 1.5 μm. Since the recess process may be faster for wider trenches, a distance d5 between the first surface 101 and an exposed surface of the gate electrode structure 150 in the contact trench 413 may be greater than the distance d4.

A fill material is deposited in a predominantly conformal manner, wherein a thickness of a resulting fill layer 209a is less than half of the width d2 of the contact trench 413 and greater than or equal to the half of the width d1 of the widest array trench 411. The fill layer 209a may be a homogenous layer or may include two or more sub layers of different materials. According to an embodiment, the fill layer 209a is a homogenous dielectric layer, e.g., from a silicon oxide.

As shown in FIG. 1C the fill layer 209a completely fills sections of the array and auxiliary trenches 411, 414 between the first surface 101 and the buried gate electrode structure 150, but only lines a corresponding section of the contact trench 413, thereby leaving a void in the contact trench 413 above the buried gate electrode structure 150.

An anisotropic etch removes horizontal portions of the fill layer 209a on the first surface 101 and on the buried gate electrode structure 150 in the contact trench 413. In the contact trench 413, the anisotropic etch forms a spacer structure 209c of the fill material and exposes a central portion of the gate electrode structure 150. A further conductive material, which may be the same material as the gate material or a different material, is deposited and fills the void in the contact trench 413. The further conductive material may consist of or contain heavily doped polycrystalline silicon and/or one or more metal-containing layers.

Excess material of the further conductive material outside the void in the contact trench 413 may be removed, for example by an etch process or a CMP (chemical-mechanical polishing) that may also remove portions of the gate dielectric layer 205a outside the trenches.

FIG. 1D shows resulting dielectric fill structures 209 from the fill material in the array and auxiliary trenches 411, 414 between the first surface 101 and the gate electrode structure 150. In the contact trench 413 the fill material forms the spacer structure 209c between the first surface 101 and the gate electrode structure 150. A connection plug 195 of the further conductive material extends between a plane spanned by the first surface 101 and the gate electrode structure 150.

For separating the gate electrode structures 150 assigned to different cell areas 441, 442, conventional approaches use an etch mask exposing the gate material in an array separation trench and a separation etch removes material along vertical sidewalls of the semiconductor layer 100a, with the risk that remnants of the gate material at the sidewalls of the array separation trench structurally connect and short-circuit the concerned gate electrode structures 150. In contrast, the above described recess inherently separates the gate electrode structures 150 assigned to different trench patterns 410, 420 above the array isolation region 490 and outside of trenches. Hence, the method illustrated with FIGS. 1A to 1E provides more reliably separated gate electrode structures 150, with less effort. In addition, the connection plug 195 can be formed self-aligned to the gate electrode structure 150 in the contact area 449, such that a lithography process for etching contact trenches to the buried gate electrode structure 150 can be saved.

An embodiment may provide removal of portions of the semiconductor fins 418, such that along a second lateral direction orthogonal to the first lateral direction separation trenches spatially separate sections of the semiconductor fins 418 adjoining the first surface 101. For example, a lithography process provides a cell separation etch mask with openings crossing the semiconductor fins 418 along the first lateral direction and an anisotropic etch process removes material in the vertical projection of the openings in the cell separation etch mask.

The anisotropic etch may be or may not be material-selective. For example, the etch process may have a high etch selectivity between the material of the semiconductor fins 418 and the fill material of the fill structures 209. The separation trenches may be filled with a dielectric material, which may be the same material as or another than the fill material of the fill structures 209 to form separation structures 175. Another embodiment does not provide separation trenches to define source and drain zones within each semiconductor fin 418, but may provide an on-state current flow between neighboring semiconductor fins 418.

A connection wiring 315 may be provided that may directly adjoin both the connection plug 195 assigned to the first trench pattern 410 and active transistor areas in remnant sections of the semiconductor fins 418 assigned to the second trench pattern 420. According to other embodiments, the connection wiring 315 electrically connects the connection plug 195 with source, drain or gate regions of other FET structures, which are not assigned to the first or second trench patterns 410, 420, with terminal pads, with inputs or outputs of other electric circuits integrated in the same semiconductor die, with anode or cathode regions of semiconductors diodes, with collector, emitter or base regions of bipolar junction transistor.

Figure 1E:
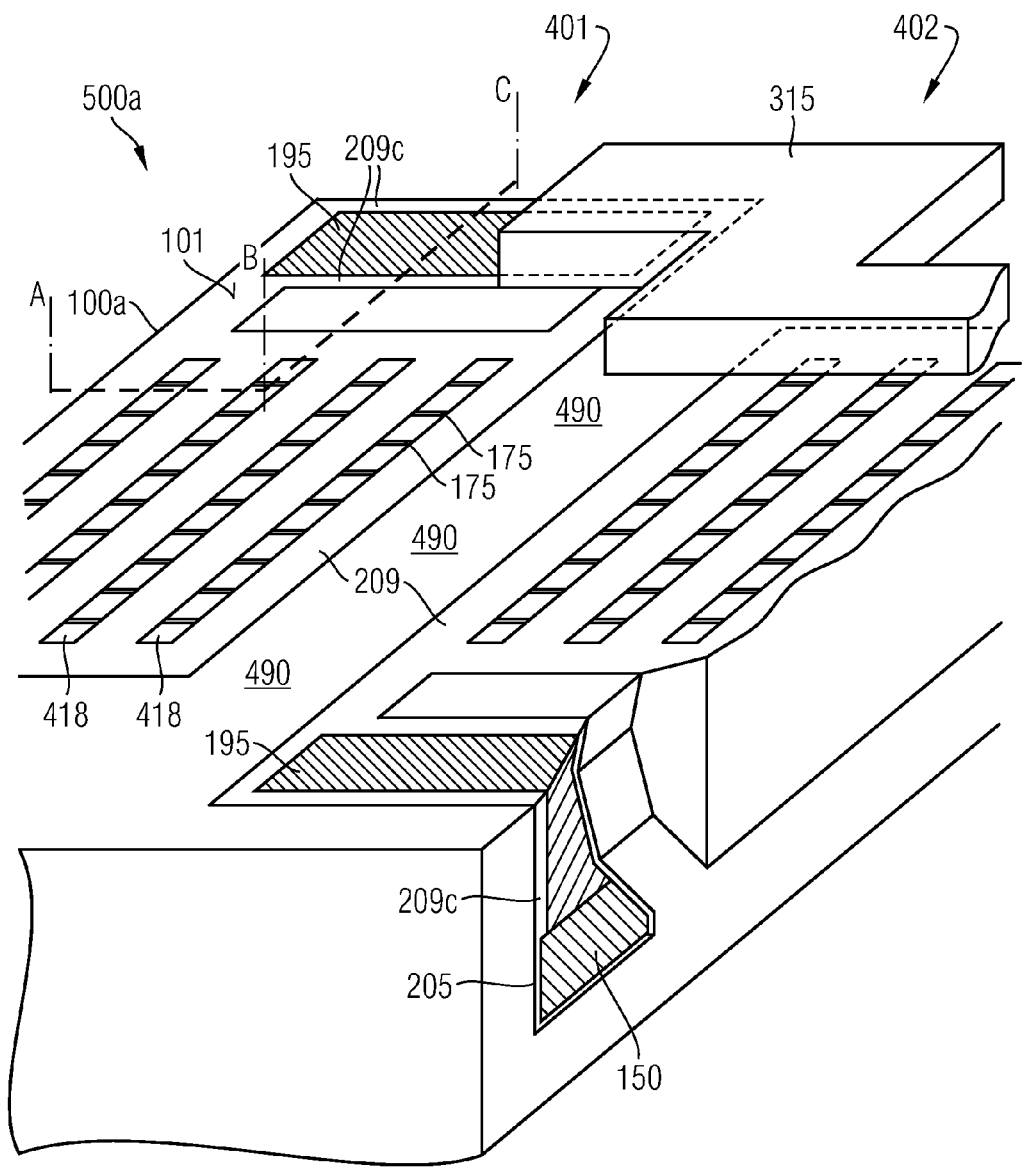
FIG. 1E is a schematic perspective view of the semiconductor substrate portion of FIG. 1D after providing separation structures and a connection wiring.

FIG. 1E shows both the separation structures 175 segmenting upper sections of the semiconductor fins 418 along the second lateral direction and the connection wiring 315 directly adjoining and electrically connecting the connection plug 195, which is assigned to the first trench pattern 410, and active transistor areas in the semiconductor fins 418 assigned to the second trench pattern 420.

The embodiments include combinations of two or more transistor devices of the same type or of different types including p channel FETs of the enhancement and depletion type and n channel FETs of the enhancement and depletion type.

Figure 2A:
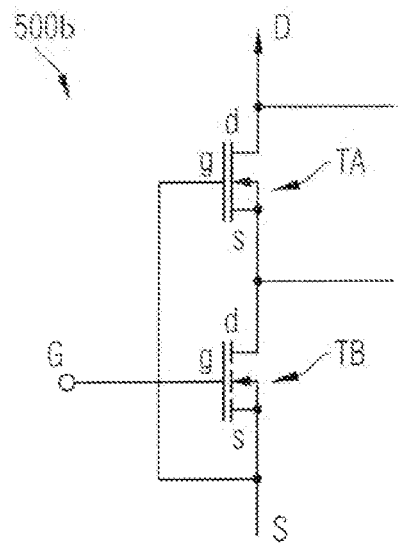
FIG. 2A is a schematic circuit diagram of a semiconductor device in accordance with an embodiment integrating an enhancement type IGFET (insulated gate field effect transistor) and a depletion type IGFET.
Figure 2C:
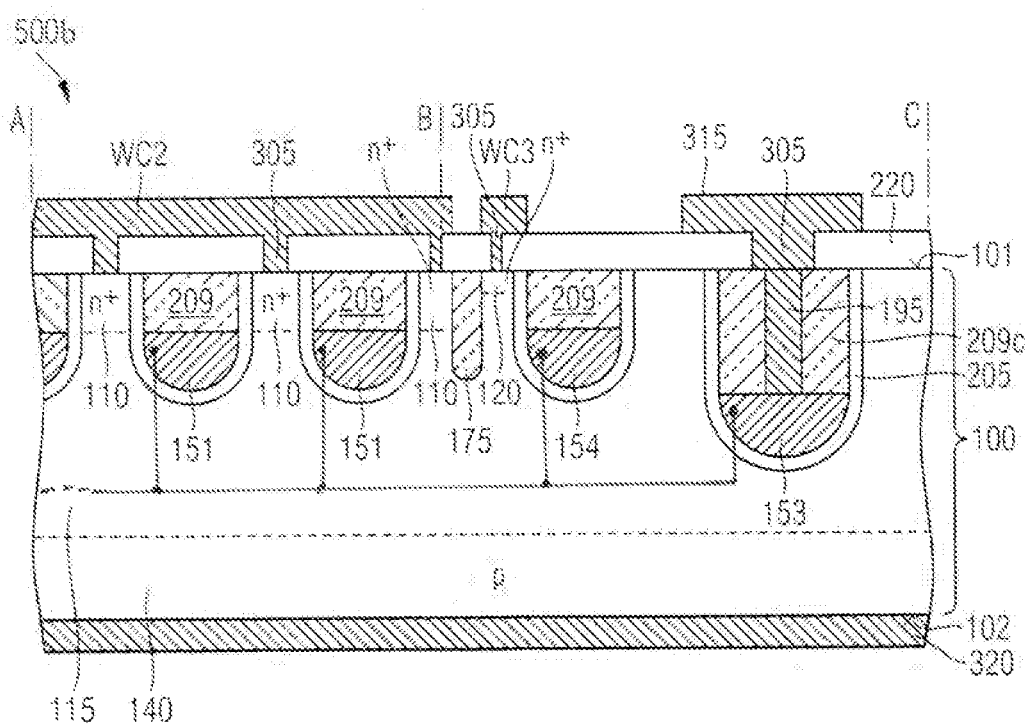
FIG. 2C is a schematic cross-sectional view of the semiconductor device of FIG. 2B along line A-B-C.

FIGS. 2A to 2C refer to an embodiment of a semiconductor device 500b which may be obtained, by way of example, by the method illustrated in FIGS. 1A to 1E.

According to FIG. 2A, the semiconductor device 500b may include at least two semiconductor switching devices, e.g., an enhancement type IGFET TB and a depletion type IGFET TA, which are arranged in a cascode connection. The load paths between the sources s and drains d of the IGFETs TA, TB are arranged in series between drain and source terminals D, S of the power semiconductor device 500b, providing an IGFET functionality. The gate terminal G of the semiconductor device 500b or the output of an integrated gate driver is electrically connected or coupled to the gate electrode g of the enhancement type IGFET TB. The source s of the enhancement type IGFET TB may be electrically connected or coupled to the gate electrode g of the depletion type IGFET TA. The drain d of the enhancement type IGFET TB is electrically connected with the source s of the enhancement type IGFET TA.

In a blocking mode, each of the IGFETs TA, TB sustains a portion of the total blocking voltage. In the conductive mode, the two IGFETs TA, TB, which are electrically arranged in series, may provide an on-state resistance that is lower or at least in the range of the on-state resistance of a single IGFET device having a comparable blocking voltage capability. Since the total blocking voltage can be modified by the numbers of transistors electrically arranged in series and integrated in the same semiconductor die in a lateral direction, device parameters like blocking voltage capability and on-state resistance for IGFET designs can be modified without modifying the thickness of semiconductor substrates through expensive grinding and polishing processes.

FIG. 2B shows a portion of the semiconductor device 500b with a first cell array 451 including transistor cells TC assigned to a first switching device that may be, by way of example, the depletion type IGFET TA of FIG. 2A, and with a second cell array 452 including transistor cells TC assigned to a second switching device, which may be, by way of example, the enhancement type IGFET TB of FIG. 2A.

The cell arrays 451, 452 include notched semiconductor fins 180 with source regions s1, s2 and drain regions d1, d2 oriented to the same surface side of the semiconductor device 500b.

The first and second cell arrays 451, 452 are arranged along a first lateral axis. Within each cell array 451, 452 the transistor cells TC are arranged in a matrix, wherein source regions s1, s2 of a subset of adjacent transistor cells TC are arranged along the first lateral direction and the drain regions d1, d2 are arranged along a second lateral direction orthogonal to the first lateral direction with respect to the source region s1, s2 of the respective transistor cell TC. The source regions s1 of the first cell array 451 may be in the projection of the drain regions d2 of the second cell array 452 along the first lateral direction, and the source region s2 of the second cell array 452 may be in the projection of the drain regions d1 of the first cell array 451 along the first lateral direction. In each cell array 451, 452 the respective gate electrode structure 150 includes array stripes 151 forming active gate electrodes, wherein the array stripes 151 run between neighboring notched semiconductor fins 180 along the second lateral direction.

Separation structures 175 in the notched semiconductor fins 180 separate source and drain regions s1, d1 or s2, d2 assigned to the same semiconductor fin 180 between the same pair of array stripes 151.

First wiring connections WC1 extend along the first lateral direction and may electrically connect the second source regions s2 arranged along the first lateral direction in the second cell array 452 with each other and with a source connector SC. Second wiring connections WC2 electrically connect the second drain regions d2 in the second cell array 452 arranged along the first lateral direction with each other and with first source regions s1 in the first cell array 451. Third wiring connections WC3 electrically connect first source regions s1 arranged along the first lateral direction with each other and, e.g. with a drain connector or source regions of a further cell array assigned to a further switching device integrated in the same semiconductor die. The source connector SC may be electrically connected or coupled to a source terminal S of the semiconductor device 500b and the drain connector may be electrically connected or coupled to a drain terminal D of the semiconductor device 500b.

The gate electrode structure 150 in the first cell array 451 further includes a contact stripe 153 connected with the array stripes 151, wherein one, two or more spacer stripes 152 may structurally connect the array stripes 151 with the contact stripe 153. A connection plug 195 is formed between the first surface 101 and the contact stripe 153. A connection wiring 315 directly adjoins semiconductor areas of the transistor cells TC in the second cell array 452, for example the first source regions s1, and the connection plug 195. The connection wiring 315 may be structurally and electrically connected with one or more of the first wiring connections WC1.

According to FIG. 2C, fill structures 209 above the array stripes 151, auxiliary stripes 154 and the spacer stripes 152 of FIG. 2B spatially separate the gate electrode 150 from the first surface 101 of the semiconductor portion 100. Outside the first cell array 451, the connection plug 195 extends between the first surface 101 and the gate electrode 150 and laterally framed by a spacer structure 209c of the fill material.

The drain regions d1, d2 are drain impurity zones 120 directly adjoining the first surface 101 in first portions of the notched semiconductor fins 180. Source regions 110 are formed in second sections of the notched semiconductor fins 180 and extend from the first surface 101 up to a distance to the first surface 101 that corresponds to the distance between the gate electrodes 150 and the first surface 101. Each source region 110 may be an impurity zone or may include a heavily doped polycrystalline first section directly adjoining the first surface 101 and a single crystalline second section directly adjoining the first section.

The semiconductor portion 100 may further include a substrate layer 140 directly adjoining a second surface 102 parallel to the first surface 101. The substrate layer 140 may have an impurity type opposite to the impurity type of the source and drain regions 110, 120. Between the source and drain regions 110, 120 on the one side and the substrate layer 140 on the other side, the semiconductor portion 100 includes a channel/body layer 115 directly adjoining the source and drain regions 110, 120. For transistors of the enhancement type, the channel/body layer 115 includes portions of the opposite conductivity type of the source and drain regions 110, 120 structurally connecting the source and drain regions 110, 120. For depletion type transistors, the channel/body layer 115 includes portions of the same conductivity type as the source and drain regions 110, 120 structurally connecting the source and drain regions 110, 120. The channel/body layer 115 may include further impurity zones, e.g., for separating neighboring transistor cells TC or cell arrays through pn junctions.

For depletion type transistors, a suitable voltage applied at the gate electrode structure 150 fully depletes the portion of the channel/body layer between the source and drain regions 110, 120 such that the transistor cells TC are in an off-state.

Otherwise, a current flows between the source and drain regions of each transistor cell TC. For enhancement type transistors, a conductive channel of minority charge carriers may be formed in the channel/body layer 115 when a potential applied at the gate electrode structure 150 is sufficiently high.

The first, second and third wiring connections WC1, WC2, WC3 may directly adjoin the first surface 101 or a plane spanned by the first surface 101. Other embodiments may provide a dielectric layer 220, wherein contacts 305 extending through openings in the dielectric layer 220 electrically connect the first, second and third wiring connections WC1, WC2, WC3 with the source regions 110 and drain regions 120 as well as the connection wiring 315 with the connection plug 195.

Figure 3A:
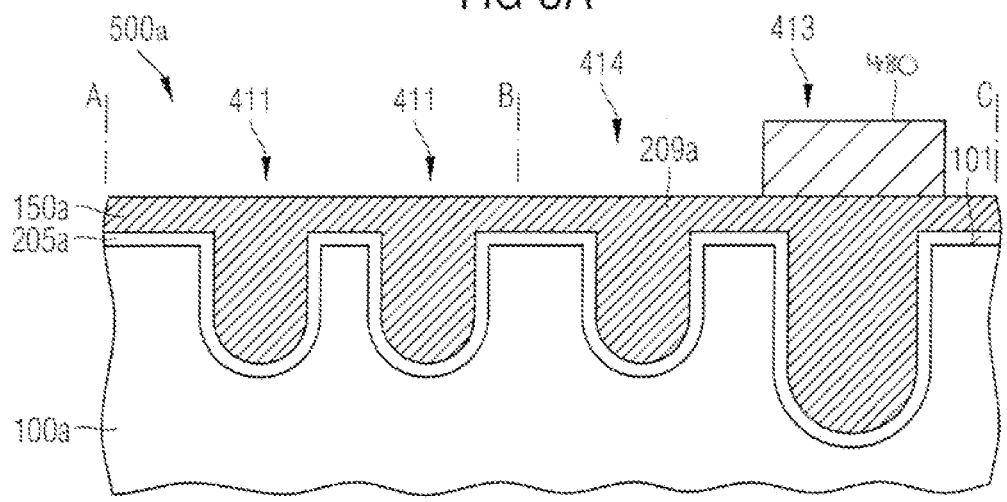
FIG. 3A is a schematic cross-sectional view of a portion of a semiconductor substrate for illustrating a method of manufacturing a semiconductor device in accordance with an embodiment relying on a recess mask for providing a self-aligned gate connection, after providing the recess mask.
Figure 3B:
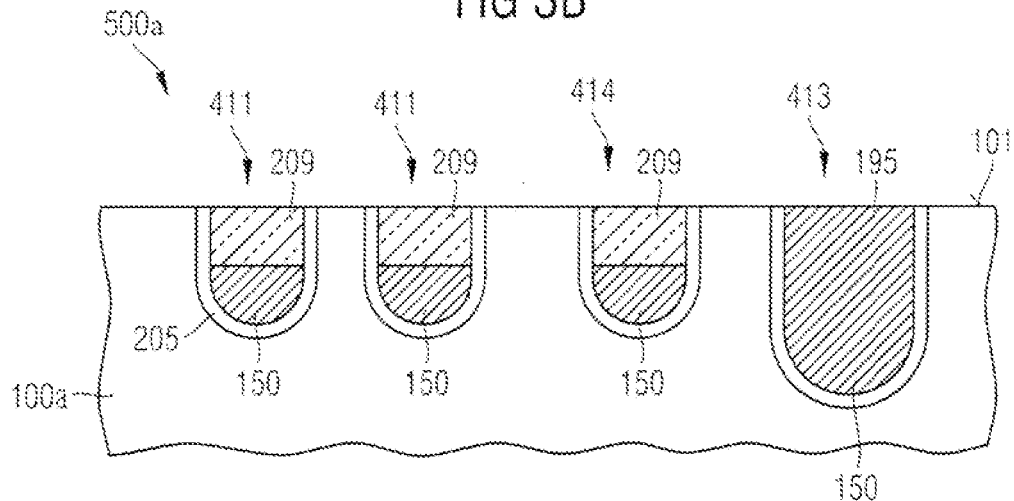
FIG. 3B is a schematic cross-sectional view of the semiconductor substrate portion of FIG. 3A after recessing exposed portions of the gate material and providing fill structures.
Figure 3C:
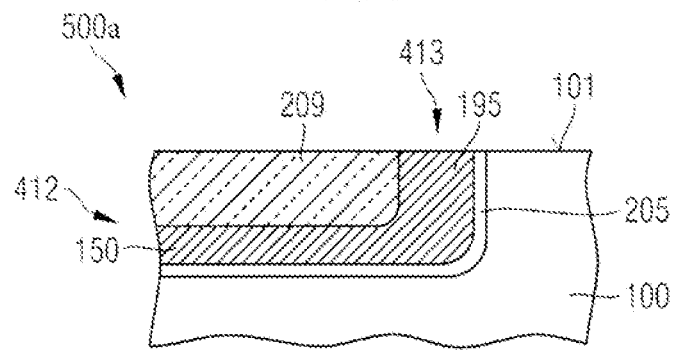
FIG. 3C is a portion cross-sectional view of the semiconductor substrate portion of FIG. 3B in a plane parallel to the cross-sectional plane of FIG. 3B.

FIGS. 3A to 3C refer to a method providing the gate electrode structure 150 using a recess etch mask. As regards introducing a first and a second trench pattern 410, 420 into a semiconductor layer 100a, the formation of a gate dielectric layer 205a formed on the exposed semiconductor material of the semiconductor layer 100a and deposition of a conductive gate material 150a that fills the trenches of the first and second trench patterns 410, 420 reference is made to the description of FIGS. 1A to 1B, wherein the contact trench 431 is not necessarily wider than the widest array trench 411 but may have, e.g., the same width.

After deposition of the gate material, a recess mask layer is deposited and patterned by photolithographic means to form an etch mask 480. The etch mask 480 may be provided on the deposited gate material 150a. The gate material 150a may be or may not be partially recessed before applying the recess mask layer. For example, the gate material 150a may be etched and/or chemically-mechanically polished such that horizontal portions above the first surface 101 are completely removed before providing the recess etch mask 480, which then may be formed directly on the first surface 101 or the gate dielectric layer 205a.

The recess etch mask 480 covers at least a portion of the gate material 150a in the contact trench 413 and exposes the gate material in the array trenches 411 and the auxiliary trenches 414. An isotropic etch may be performed that recesses the gate electrode material 150a at least in the array trenches 411 and the auxiliary trenches 414. At least in a portion of the contact trench 413, the gate material is not recessed. A fill material is deposited that fills the array trenches 411 above the recessed gate material forming the buried gate electrode structures 150. Excess portions of the fill material above the first surface 101 are removed as described with reference to FIG. 1D.

FIG. 3B shows the fill structures 209 extending between the first surface 101 and the gate electrode 150 in the array and auxiliary trenches 411, 414. At least in a portion of the contact trench 413, an exposed surface of the gate material is flush with the first surface 101 and can be electrically connected to a connection wiring in the same wiring plane as the contact, source and drain regions formed between the array trenches 411.

FIG. 3C is a cross-sectional plane parallel to the cross section line B-C of FIG. 3B along a spacer trench 412. In the region of the contact trench 413, a portion of the gate material forms the connection plug 195.

Figure 4:
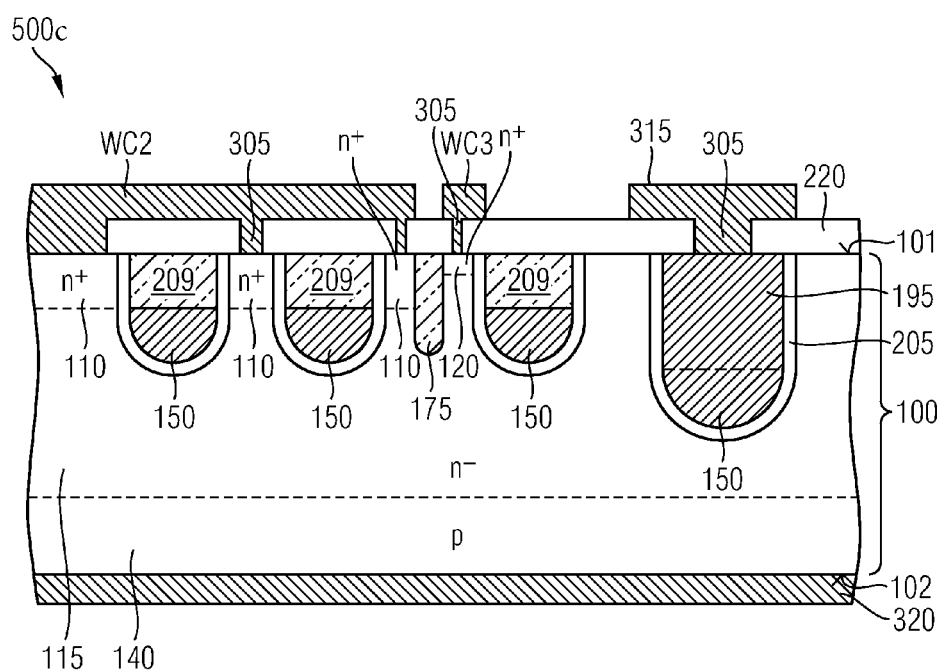
FIG. 4 is a cross-sectional view of a portion of a semiconductor device manufactured according to the method of FIGS. 3A to 3C.

FIG. 4 shows a semiconductor device 500c resulting from the method described in FIG. 3A to 3C. As opposed to the semiconductor device 500b of FIG. 2C, the contact trench 413 in FIG. 4 does not provide a spacer structure of the fill material 290. Instead, the gate material may fill a complete cross-section of at least a longitudinal portion of the contact trench 413. A portion of the gate material forms the connection plug 195.

Figure 5A:
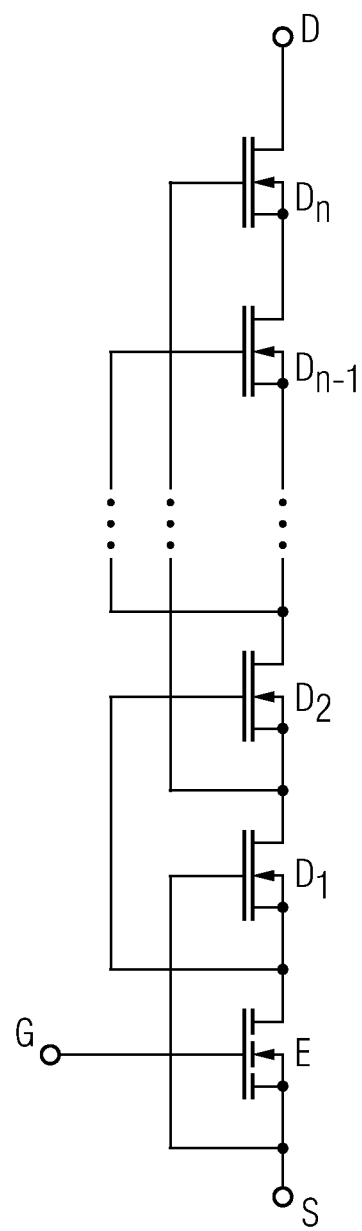
FIG. 5A is a circuit diagram of an ADZFET (active drift zone field effect transistor).

FIG. 5A shows a semiconductor device 500d based on a plurality of switching devices electrically arranged in a cascode configuration. According to the illustrated embodiment, the semiconductor device 500d includes an enhancement type IGFET E and a plurality of depletion type IGFETs D1, D2, Dn.

Figure 5B:
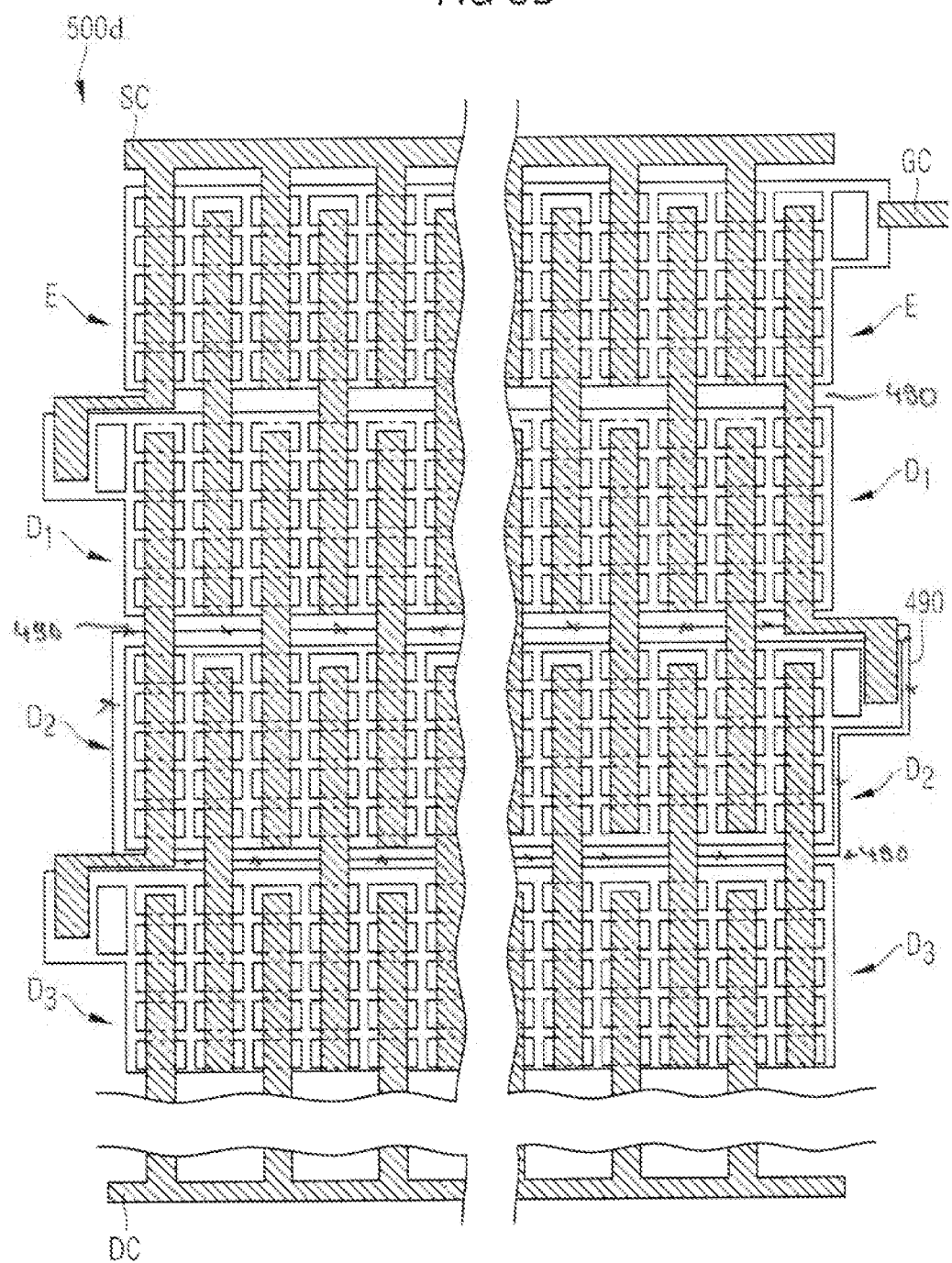
FIG. 5B is a plan view of a wiring plane of the ADZFET of FIG. 5A in accordance with a further embodiment of the invention.

FIG. 5B shows a planar view of the wiring connections of the semiconductor device 500d of FIG. 5A following the pattern described above. Each of the IGFETs E, D1, D2, Dn may be completely surrounded in the lateral directions by an array isolation region 490. Each of the switching devices may include a gate connection as described above. The gate wiring GC electrically connected to the gate electrode structure 150 of the enhancement type IGFET may be electrically connected or coupled to an output terminal of an internal gate driver circuit or a gate terminal.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a first gate electrode structure buried in a semiconductor portion and comprising array stripes inside a first cell array of transistor cells and a contact stripe outside the first cell array, the array stripes of the first gate electrode structure structurally connected with each other and structurally connected with the contact stripe;
a second gate electrode structure buried in the semiconductor portion and comprising array stripes inside a second cell array of transistor cells, wherein the array stripes of the second gate electrode structure are structurally connected wit each other and an array isolation region of the semiconductor portion spatially separates the first and second gate electrode structures; and
a connection plug extending between a first surface of the semiconductor portion and the contact stripe of the first gate electrode structure.

2. The semiconductor device of claim 1, wherein the contact stripe is wider than the array stripes.

3. The semiconductor device of claim 1, wherein a fill structure extends between the first surface and the array stripes and a spacer structure from a material of the fill structure extends along the connection plug between the first surface and the first gate electrode structure.

4. The semiconductor device of claim 1, comprising at least one spacer stripe structurally connecting the array stripes with the contact stripe.

5. The semiconductor device of claim 1, comprising semiconductor fins between the array stripes, wherein separation structures spatially separate sections of the semiconductor fins adjoining the first surface.

6. The semiconductor device of claim 1, comprising a connection wiring directly adjoining both the connection plug assigned to the first cell array and sections of semiconductor fins assigned to the second cell array.

7. The semiconductor device of claim 1, wherein the array isolation region completely surrounds the first cell array in lateral directions parallel to the first surface.

8. A power semiconductor device with active drift zone, the power semiconductor device comprising:
- a first gate electrode structure buried in a semiconductor portion and comprising array stripes inside a first cell array of transistor cells and a contact stripe outside the first cell array, the array stripes of the first gate electrode structure structurally connected with each other and with the contact stripe structurally connected with the array stripes;
- a second gate electrode structure buried in the semiconductor portion and comprising array stripes inside a second cell array of transistor cells, wherein an array stripes of the second gate electrode structure are structurally connected with each other and an array isolation region of the semiconductor portion spatially separates the first and second gate electrode structures;
- a connection plug extending between a first surface of the semiconductor portion and the contact stripe of the first gate electrode structure; and
- a connection wiring directly adjoining active semiconductor areas of the transistor cells of the second cell array and the connection plug.

\* \* \* \* \*